United States Patent
Cheng et al.

(10) Patent No.: US 9,520,328 B2
(45) Date of Patent: Dec. 13, 2016

(54) TYPE III-V AND TYPE IV SEMICONDUCTOR DEVICE FORMATION

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/157,550

(22) Filed: May 18, 2016

(65) Prior Publication Data
US 2016/0260641 A1   Sep. 8, 2016

Related U.S. Application Data

(62) Division of application No. 14/585,755, filed on Dec. 30, 2014.

(51) Int. Cl.
*H01L 29/06* (2006.01)
*H01L 29/66* (2006.01)
(Continued)

(52) U.S. Cl.
CPC . *H01L 21/823878* (2013.01); *H01L 21/30612* (2013.01); *H01L 21/823807* (2013.01); *H01L 21/823821* (2013.01); *H01L 27/0924* (2013.01)

(58) Field of Classification Search
CPC .................. H01L 21/823878; H01L 21/30612; H01L 21/823807
(Continued)

(56) References Cited

U.S. PATENT DOCUMENTS 5,470,785 A   11/1995 Kondo
6,475,072 B1  11/2002 Canaperi et al.
(Continued)

FOREIGN PATENT DOCUMENTS

JP   61275195 A   12/1986
JP   63069792 A   3/1988
(Continued)

OTHER PUBLICATIONS

Cheng et al., "Type III-V and Type IV Semiconductor Device Formation", U.S. Appl. No. 14/585,755, filed Dec. 30, 2014.
(Continued)

*Primary Examiner* — Dzung Tran
(74) *Attorney, Agent, or Firm* — Heather S. Chatterton (57) ABSTRACT

Forming a semiconductor device is disclosed, according to embodiments of the present disclosure. Forming the semiconductor device can include forming a first semiconductor layer directly on a silicon substrate. Forming the semiconductor device can include forming a second semiconductor layer directly on the first semiconductor layer and forming an insulating trench in the second semiconductor layer. Forming the semiconductor device can include removing the second portion of the second semiconductor layer, and forming a third semiconductor layer directly on the first semiconductor layer and adjacent to the insulating trench such that the first portion of second semiconductor layer is electrically insulated from the third semiconductor layer. The first semiconductor layer and the third semiconductor layer can each be a type III-V semiconductor and the second semiconductor layer can be a type IV semiconductor.

13 Claims, 11 Drawing Sheets

(51) Int. Cl.
*H01L 21/20* (2006.01)
*H01L 21/8238* (2006.01)
*H01L 27/092* (2006.01)
*H01L 21/306* (2006.01)

(58) Field of Classification Search
USPC .................. 257/618, 183, 192; 438/478
See application file for complete search history.

(56) References Cited

U.S. PATENT DOCUMENTS

| | | | |
|---|---|---|---|
| 6,682,965 | B1 | 1/2004 | Noguchi et al. |
| 7,972,936 | B1 | 7/2011 | Brewer et al. |
| 8,558,285 | B2 | 10/2013 | Mishra et al. |
| 2002/0168864 | A1 | 11/2002 | Cheng et al. |
| 2006/0113603 | A1* | 6/2006 | Currie ................ H01L 27/1203 257/368 |
| 2006/0145264 | A1 | 7/2006 | Chidambarrao et al. |
| 2006/0228851 | A1* | 10/2006 | Sadaka ............... H01L 29/1054 438/221 |
| 2007/0087525 | A1* | 4/2007 | Chen ................. H01L 21/76254 438/429 |
| 2007/0181977 | A1 | 8/2007 | Lochtefeld et al. |
| 2008/0217690 | A1 | 9/2008 | Mandelman et al. |
| 2009/0039361 | A1 | 2/2009 | Li et al. |
| 2009/0095981 | A1* | 4/2009 | Kang ................ H01L 21/82380 257/190 |
| 2009/0160061 | A1* | 6/2009 | Hsu .................. H01L 21/76898 257/763 |
| 2010/0213512 | A1 | 8/2010 | Ko |
| 2010/0295096 | A1 | 11/2010 | Cooke et al. |
| 2013/0056793 | A1 | 3/2013 | Srinivasan |

FOREIGN PATENT DOCUMENTS

| | | |
|---|---|---|
| JP | 02194519 A | 8/1990 |
| WO | 2006060054 A1 | 6/2006 |

OTHER PUBLICATIONS

List of IBM Patents or Patent Applications Treated as Related, May 17, 2016, pp: 1-2.

* cited by examiner

TYPE III-V AND TYPE IV SEMICONDUCTOR DEVICE FORMATION

BACKGROUND

The present disclosure relates to semiconductor device formation, and more specifically, to forming a semiconductor device including type IV semiconductor material and type III-V semiconductor material.

In integrated circuit manufacturing and formation, as performance improvements have been sought for advancement in technology nodes, type III-V semiconductor material and type IV semiconductor material have been identified as possible options for various integrated circuits. For example, type III-V and type IV semiconductor material could be used in construction of transistors or other various devices.

SUMMARY

According to embodiments of the present disclosure, a method of forming a semiconductor device is disclosed. The method can include forming a first semiconductor layer directly on a silicon substrate, the first semiconductor layer having a first region adjacent to an interface between the first semiconductor layer and the silicon substrate and a second region adjacent to the first region. The first region can include a first concentration of defects and the second region can include a second concentration of defects. The method can include forming a second semiconductor layer directly on the first semiconductor layer and forming an insulating trench in the second semiconductor layer defining a first portion of the second semiconductor layer electrically insulated from a second portion of the second semiconductor layer. The method can include removing the second portion of the second semiconductor layer, and forming a third semiconductor layer directly on the first semiconductor layer and adjacent to the insulating trench such that the first portion of second semiconductor layer is electrically insulated from the third semiconductor layer. The first semiconductor layer and the third semiconductor layer can each be a type III-V semiconductor and the second semiconductor layer can be a type IV semiconductor. In embodiments, the second concentration of defects is less than the first concentration of defects.

Embodiments of the present disclosure are directed towards a method of forming a semiconductor device. The method can include forming a first semiconductor layer directly on a silicon substrate, the first semiconductor layer having a first region adjacent to an interface between the first semiconductor layer and the silicon substrate and a second region adjacent to the first region, the first region including a first concentration of defects and the second region including a second concentration of defects. The method can include forming a first insulating layer directly on the first semiconductor layer, forming a second semiconductor layer directly on the first insulating layer, and forming an insulating trench in the second semiconductor layer. The first insulating layer can define a first portion of the second semiconductor layer and a first portion of the first insulating layer electrically insulated from a second portion of the second semiconductor layer and a second portion of the first insulating layer. The method can include removing the second portion of the second semiconductor layer and the second portion of the first insulating layer. The method can include forming a third semiconductor layer directly on the first semiconductor layer adjacent to the insulating trench such that the third semiconductor layer is electrically insulated from the first portion of the second semiconductor layer and the first portion of the first insulating layer. The first semiconductor layer and the third semiconductor layer can each be a type III-V semiconductor and the second semiconductor layer can be a type IV semiconductor. The second concentration of defects can be less than the first concentration of defects.

Embodiments of the present disclosure are directed towards a semiconductor device. The semiconductor device can include a silicon substrate and a first semiconductor layer directly on the silicon substrate. The first semiconductor layer can have a first region adjacent to an interface between the first semiconductor layer and the silicon substrate and a second region adjacent to the first region. The first region can include a first concentration of defects and the second region can include a second concentration of defects. The second concentration of defects can be less than the first concentration of defects. The device can include a second semiconductor layer on the first semiconductor layer, a third semiconductor layer directly on the first semiconductor layer, and an insulating trench directly on the first semiconductor layer. The insulating trench can be directly adjacent to the second semiconductor layer and the third semiconductor layer, such that the insulating trench electrically insulates the second semiconductor layer from the third semiconductor layer. In embodiments, the first semiconductor layer and the third semiconductor layer are each a type III-V semiconductor and the second semiconductor layer is a type IV semiconductor.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to semiconductor device formation, more particular aspects relate to forming a semiconductor device including type IV semiconductor material and type III-V semiconductor material. While the present disclosure is not necessarily limited to such applications, various aspects of the disclosure may be appreciated through a discussion of various examples using this context.

Aspects of the present disclosure are directed towards a method of forming a semiconductor device. The method can include forming a first semiconductor layer directly on a silicon substrate and forming a second semiconductor layer on the first semiconductor layer. Described further herein, in embodiments, the first semiconductor layer is a type III-V semiconductor and the second semiconductor layer is a type IV semiconductor.

The method can include forming an insulating trench in the second semiconductor layer defining a first portion of the second semiconductor layer and a second portion of the second semiconductor layer. The method can include removing the second portion of the second semiconductor layer and forming a third semiconductor layer directly on the first semiconductor layer adjacent to the insulating trench. Described further herein, in embodiments, the third semiconductor layer is a type III-V semiconductor. The third semiconductor layer can be positioned adjacent to the insulating trench such that the insulating trench electrically insulates the first portion of the second semiconductor layer from the third semiconductor layer.

In integrated circuit manufacturing and formation, as performance improvements have been sought for advancement of semiconductors in new technology nodes, type III-V semiconductor material and type IV semiconductor material have been identified as possible options for CMOS integrated circuits. For example, type III-V nFETs and type IV pFETs could be an option for 7 nm and other technology nodes.

Type III-V materials can have very high electron mobility, so making nFETs using III-V material can provide improved performance for various device nodes. In some instances, hole mobility in type III-V semiconductors is relatively low. Thus, it can prove beneficial to construct nFETs using type III-V material and pFETs from type IV material. In some instances, type III-V integrated circuits can be positioned on a shared silicon substrate, integrated with type IV integrated circuits. For example, type III-V nFETs can be integrated on a shared wafer with type IV pFETs.

However, integration on a silicon substrate can be difficult, as type III-V semiconductors can have a larger lattice constant than silicon. Because of the difference in the lattice constant, integration of type III-V and type IV semiconductor material on the silicon substrate can result in defects and in topography variations in the semiconductor materials.

Embodiments of the present disclosure are directed towards a method of forming a semiconductor device that includes type III-V semiconductor material integrated with a type IV semiconductor material on a shared silicon substrate. Described further herein, in embodiments, the method can result in reduced defects in the semiconductor device and can reduce topography variations.

Figure 1:
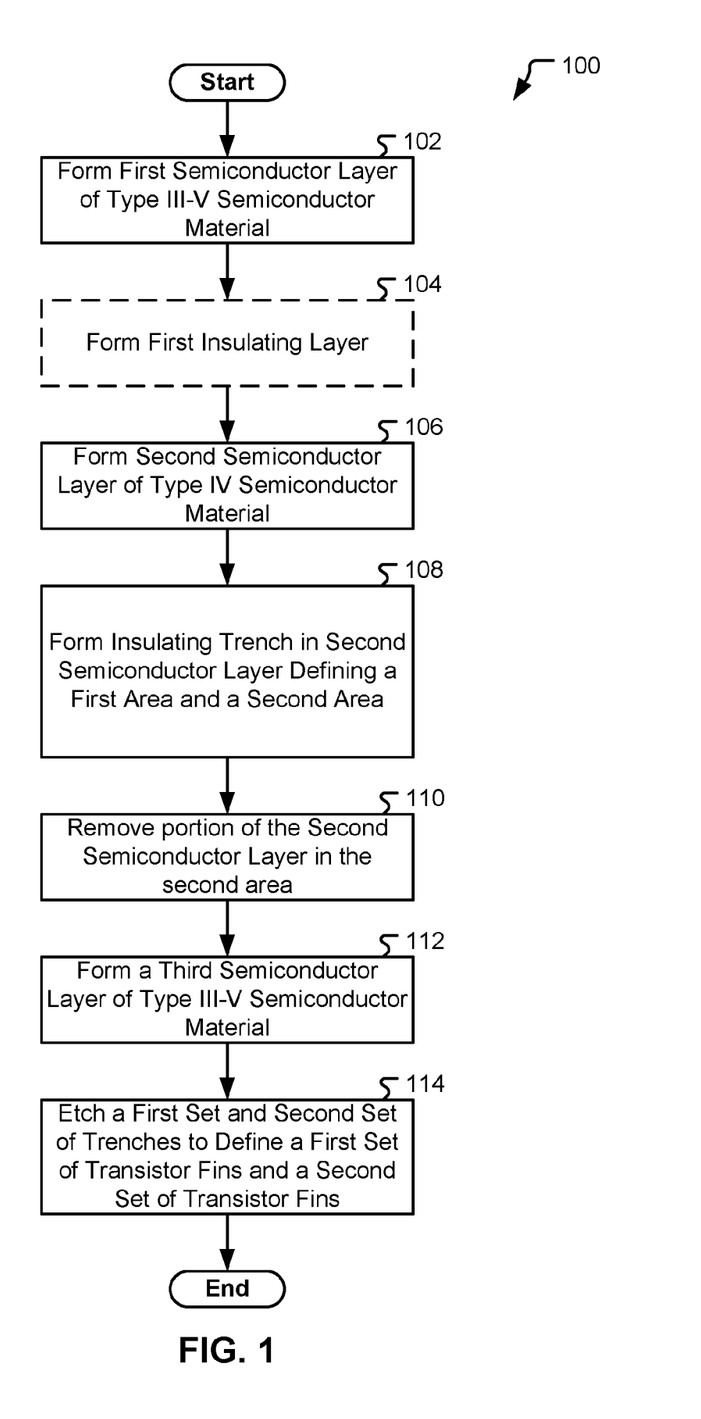
FIG. 1 depicts a flowchart diagram of a method of forming a semiconductor device, according to embodiments of the present disclosure.

Referring now to FIG. 1, a flowchart of a method 100 of forming a semiconductor device can be seen according to embodiments of the present disclosure.

In operation 102, a first semiconductor layer can be formed directly on a silicon substrate. In embodiments, the first semiconductor layer can be formed by epitaxial growth of a layer of type III-V semiconductor material on the silicon substrate. Type III-V semiconductor material can be a compound including an element from group 15 of the periodic table and an element from group 13 of the periodic table. For example, the type III-V semiconductor material can include but is not limited to GaAs (gallium arsenide), InP (indium phosphide), or InGaAs (indium gallium arsenide), In embodiments, the first semiconductor layer can be a semi-insulating type III-V semiconductor. Semi-insulating type III-V semiconductor material can provide improved electrical isolation between adjacent devices on the semiconductor device, described further herein. For example in embodiments, the first semiconductor layer can be iron doped InP such that the InP layer becomes semi-insulating. For example, in embodiments, the first semiconductor material could be semi-insulating iron doped InP layer having a carrier concentration of approximately $10^6$ $cm^{-3}$. In some embodiments the first semiconductor layer could be InAlAs (indium aluminum arsenide). In embodiments, InAlAs has a wide bandgap (a wide bandgap semiconductor) and can act as an isolator. In embodiments, InGaAs with 53% In, InAlAs with 48% In can have approximately the same lattice constant as InP and can be grown on each other with reduced lattice mismatch related defects.

In embodiments, because the first semiconductor layer is constructed from type III-V semiconductor material, the first semiconductor layer can have a larger lattice constant than the silicon substrate. For example, in embodiments, the first semiconductor layer can have a lattice constant selected substantially in the range of 0.56 nanometers to 0.66 nanometers. In some embodiments, the silicon substrate can have a lattice constant approximately in the range of 0.54 nanometers to 0.55 nanometers.

Because of the difference in the lattice constant, as the first semiconductor layer is grown, defects can form in the layer near where the silicon substrate and the first semiconductor layer interface. Thus, the first insulating layer can be formed to have a sufficient thickness, such that defects can be concentrated in a region near the interface between the layers. This can reduce interference in integrated circuits, such as transistors, constructed on the first semiconductor layer. Thus, in embodiments, the first semiconductor layer can be formed on the silicon substrate to have a thickness of approximately within a range of 500 nanometers to 5 microns.

In operation 104, a first insulating layer can be formed directly on the first semiconductor layer. The first insulating layer can be a relatively thin layer of insulating material, such as silicon oxide, or other suitable material, formed on the first insulating layer. Described further herein, in embodiments, a second semiconductor layer can be formed directly on the first insulating layer and can improve electrical isolation of the second semiconductor layer. In embodiments, the first insulating layer can have a thickness selected as a number in the range of 20 nm to 200 nm.

In embodiments, the first insulating layer is formed on the first semiconductor layer using wafer bonding techniques. In some embodiments, operation 104 is optional, and the method can progress from operation 102 directly to operation 106.

In operation 106, a second semiconductor layer can be formed on the first semiconductor layer. As described herein, in embodiments, the second semiconductor layer can be formed directly on the first insulating layer. In some embodiments, where operation 104 is bypassed, the second semiconductor layer can be formed directly on the first insulating layer. In embodiments, the second semiconductor layer can be formed directly on the first semiconductor layer using wafer bonding techniques.

In embodiments, the second semiconductor layer can be formed using type IV semiconductor material. Type IV semiconductor material can be an element and/or compound formed from elements selected from group 14 of the periodic table. For example, in embodiments, the second semiconductor layer can be formed from material including, but not limited to, Si (silicon), Ge (germanium), and SiGe (silicon germanium).

In operation 108, an insulating trench can be formed. In embodiments, the insulating trench is non-conductive material that electrically isolates portions of the semiconductor layers. In embodiments, the insulating trench can be formed using shallow trench isolation techniques. For example, in embodiments, the insulating trench can be formed by etching a trench through the second semiconductor layer and the first insulating layer to the first semiconductor layer. The trench can then be filled with insulating material, such as silicon oxide, or other suitable insulator.

In embodiments, the insulating trench defines a first area and a second area on top of the first semiconductor layer, the first and second area separated by the insulating trench. The first area can include a first portion of the second semiconductor layer and the second area can include a second portion of the second semiconductor layer. In some embodiments, the first area can include a first portion of the first insulating layer and the second area can include a second portion of the first insulating layer.

Thus, in embodiments, the first portion of the second semiconductor layer can be electrically insulated from the second portion of the second semiconductor layer. In operation 110, the second portion of the second semiconductor layer can be removed from the semiconductor device. In embodiments, removal can include masking the first portion of the second semiconductor layer and etching the second portion away to the first semiconductor layer. In embodiments the first portion is masked with an insulating material such as silicon oxide or other suitable material. In some embodiments, operation 110 includes removing the second portion of the first insulating layer.

In operation 112, a third semiconductor layer can be formed directly on the first semiconductor layer. The third semiconductor layer can be formed using type III-V semiconductor material. As described above, the type III-V semiconductor material can include but is not limited to GaAs, InP, or InGaAs. In embodiments, the third semiconductor layer can be formed by epitaxial growth of the type III-V semiconductor material of the third semiconductor layer on the type III-V semiconductor material of the first semiconductor material.

In embodiments, the third semiconductor layer can be formed in the second area defined by the insulating trench, as described herein. In embodiments, the third semiconductor layer can be positioned adjacent to the insulating trench such that the insulating trench electrically insulates the first portion of the second semiconductor layer from the third semiconductor layer.

In operation 114, a first set of trenches can be etched into the first portion of the second semiconductor layer and a second set of trenches can be etched into the third semiconductor layer. The first set of trenches can define a set of type IV semiconductor fins from the first portion of the second semiconductor layer. The second set of trenches can define a set of type III-V semiconductor fins from the third semiconductor layer. In embodiments, the set of type IV semiconductor fins can be a set of pFET transistor fins. In some embodiments, the set of type III-V semiconductor fins can be a set of nFET transistor fins.

Figure 2A:
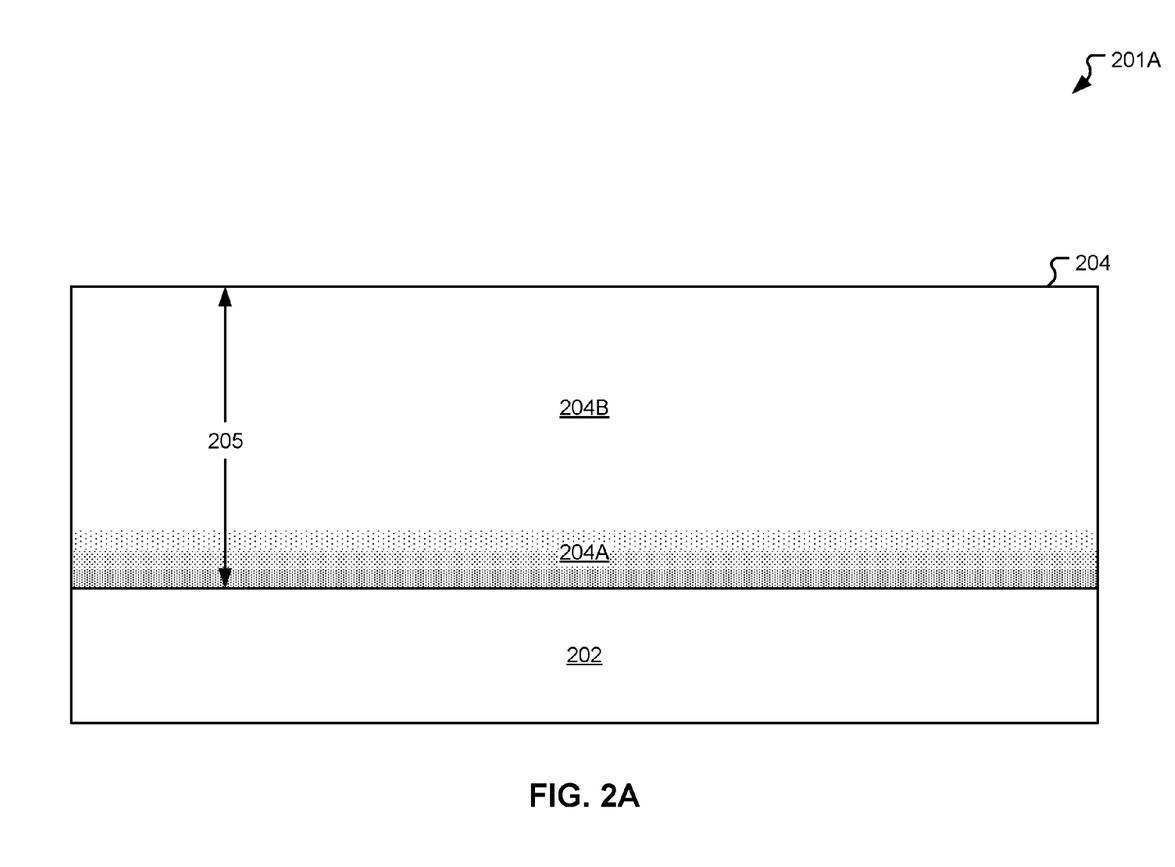
FIGS. 2A-2F depict cross sectional side views of stages of forming a semiconductor device, according to embodiments of the present disclosure.

Referring now to FIG. 2A, a cross sectional side view 201A of a stage of forming a semiconductor device can be seen according to embodiments of the present disclosure. In embodiments, side view 201A corresponds to operation 102 (FIG. 1). The side view 201A includes a silicon substrate 202 and a first semiconductor layer 204 formed directly on the silicon substrate 202. The first semiconductor layer 204 can be the same or substantially similar as described herein. As described herein, in embodiments, the first semiconductor layer 204 can be formed by epitaxial growth of the first semiconductor layer 204 on the silicon substrate 202. In embodiments, the first semiconductor layer 204 can be made from type III-V semiconductor material.

As described herein, because of the difference in the lattice constant as the first semiconductor layer 204 is grown defects can form in the first semiconductor layer 204. For example, a first region 204A can form in the first semiconductor layer 204 near where the silicon substrate 202 and the first semiconductor layer 204 interface. In embodiments, defects decrease in the first semiconductor layer 204 in regions that are further from the interface between the first semiconductor layer 204 and the silicon substrate 202. Thus, the first region 204A can have a first concentration of defects and a second region 204B, adjacent to the first region 204A can have a second concentration of defects. In embodiments, the second concentration of defects is less than the first concentration of defects. In embodiments, the first region 204A can have a thickness approximately in the range of 500 nm to 1.5 micrometers. In embodiments, the thickness of the first region 204A depends on the lattice mismatch between the first semiconductor layer 204 and the silicon substrate 202. For example, the higher the lattice mismatch the thicker the first region 204A. Thus, the first semiconductor layer 204 can be formed to have a sufficient thickness 205, such that the first semiconductor layer includes the first and second regions 204A, 204B. In embodiments, the first semiconductor layer 204 can be formed on the silicon substrate 202 to have a thickness 205 approximately within a range of 500 nanometers to 10 microns, as described herein.

Figure 2B:
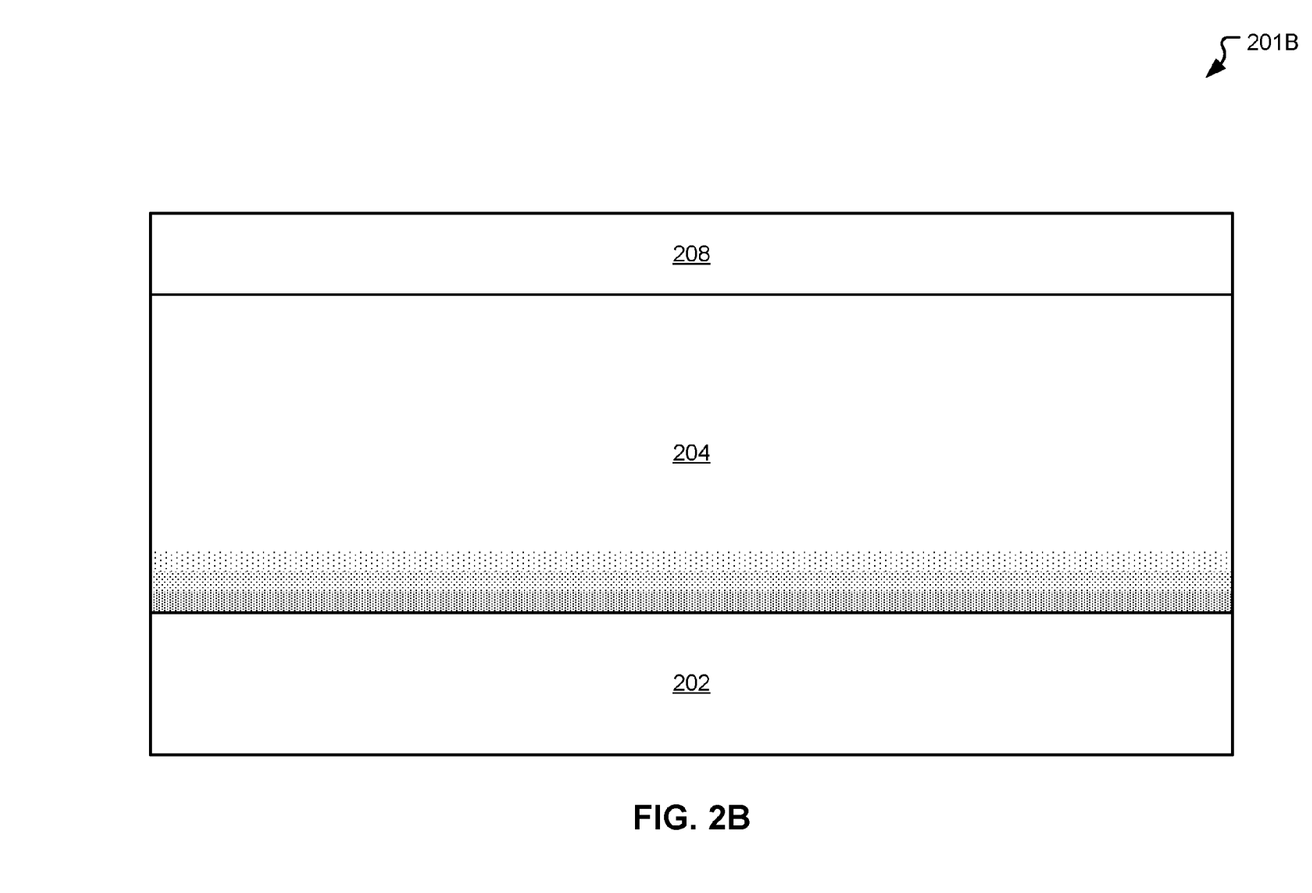

Referring now to FIG. 2B, a cross sectional side view 201B of a stage of forming a semiconductor device can be seen according to embodiments of the present disclosure. In embodiments, side view 201B can correspond to operation 106 (FIG. 1). The side view 201B includes the first semiconductor layer 204 formed directly on the silicon substrate 202, and a second semiconductor layer 208 formed directly on the first semiconductor layer 204. The second semiconductor layer 208 can be the same or substantially similar as described herein. As described herein, the second semiconductor layer can be formed directly on the first semiconductor layer using wafer bonding techniques. In embodiments, the second semiconductor layer 208 can be formed from type IV semiconductor material.

Figure 2C:
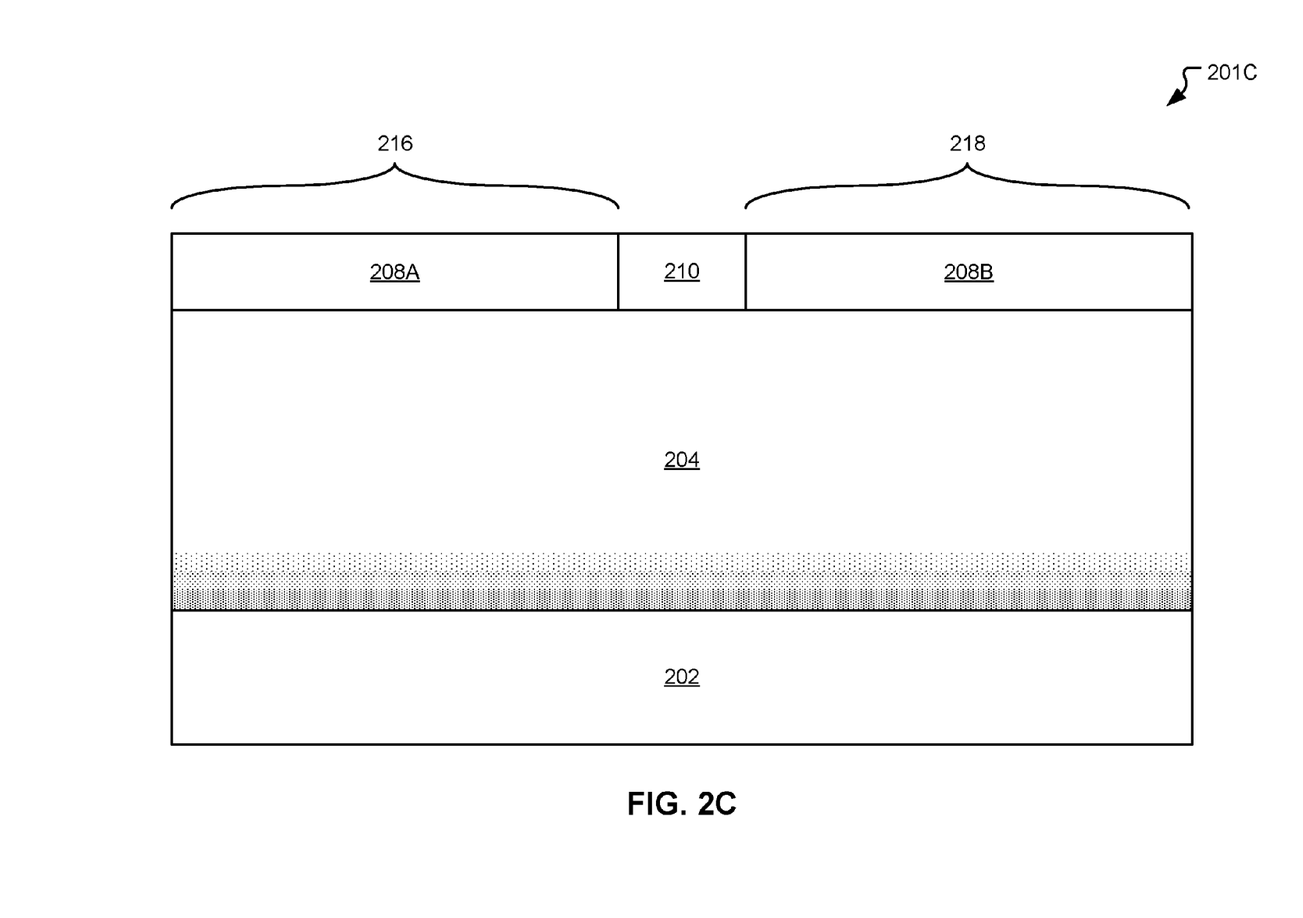

Referring now to FIG. 2C, a cross sectional side view 201C of a stage of forming a semiconductor device can be seen according to embodiments of the present disclosure. In embodiments, side view 201C can correspond to operation 108 (FIG. 1). The side view 201C includes the first semiconductor layer 204 directly on the silicon substrate 202. The side view 201C includes an insulating trench 210 defining a first area 216 separated from a second area 218 on the first semiconductor layer 204. The first area 216 can include a first portion of the second semiconductor layer 208A. The second area 218 can include a second portion of the second semiconductor layer 208B. In embodiments, the insulating trench 210 can be formed using shallow trench isolation techniques, as described herein. The insulating trench 210 can be the same or substantially similar as described herein.

Figure 2D:
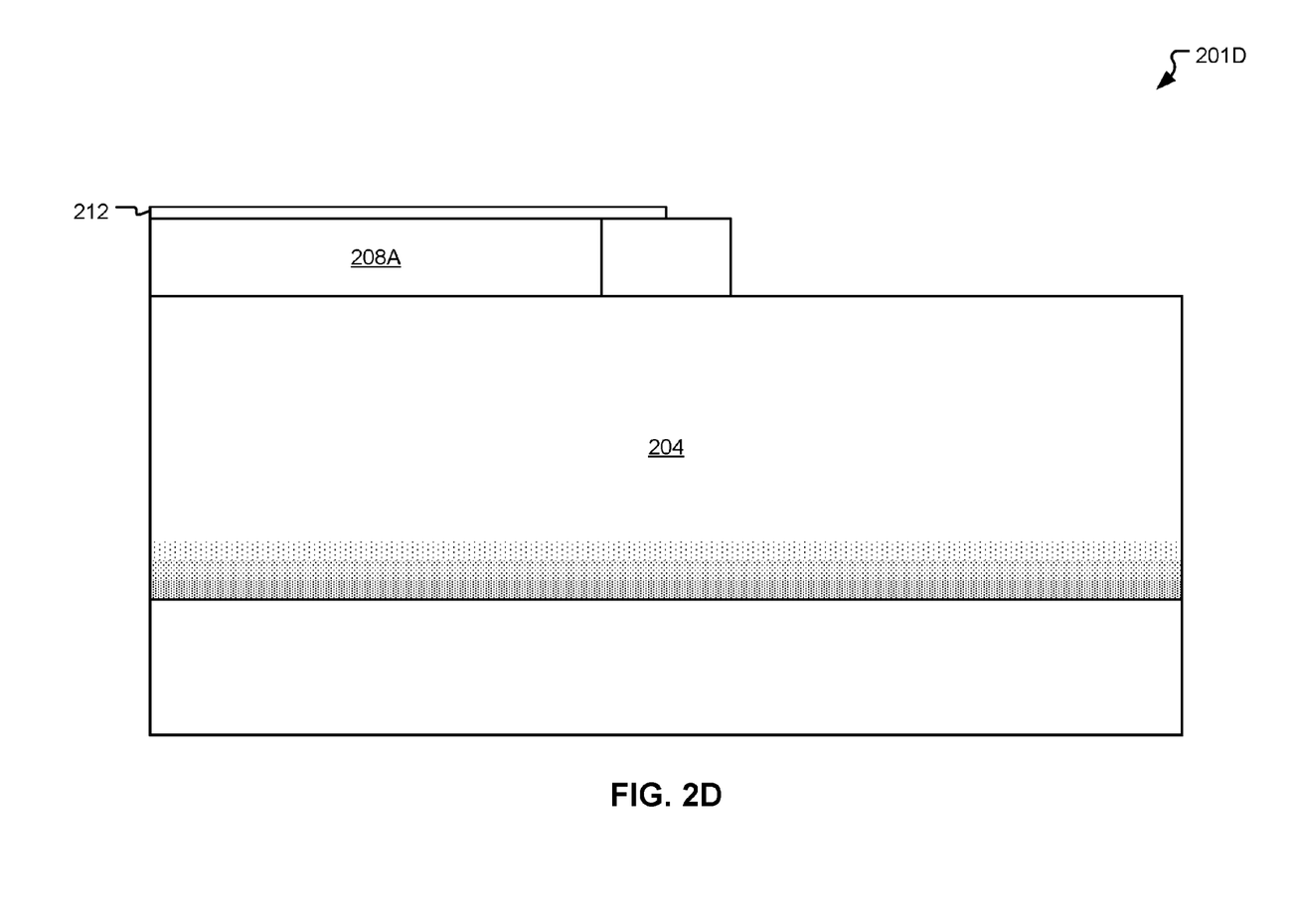

Referring now to FIG. 2D, a cross sectional side view 201D of a stage of forming a semiconductor device can be seen according to embodiments of the present disclosure. In embodiments, the side view 201D can correspond to operation 110 (FIG. 1). In side view 201D, the second portion of the second semiconductor layer 208B (FIG. 2C) has been removed from the first semiconductor layer 204, leaving the insulating trench 210 and the first portion of the second semiconductor layer 208A. In embodiments, the second portion can be removed by forming a mask 212 directly on the first portion of the second semiconductor layer 208A and etching the second portion of the second semiconductor layer through to expose the first semiconductor layer 204.

Figure 2E:
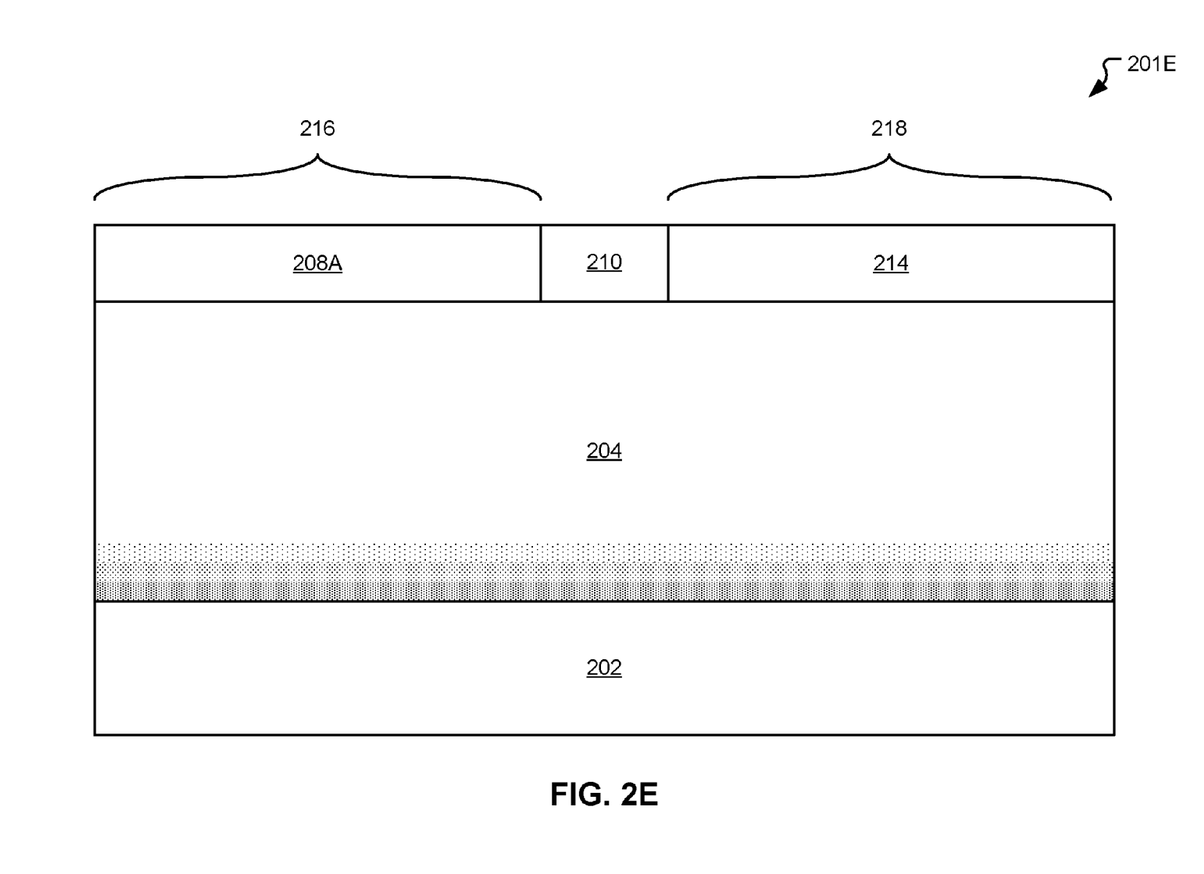

Referring now to FIG. 2E, a cross sectional side view 201E of a stage of forming a semiconductor device can be seen according to embodiments of the present disclosure. In embodiments, the side view 201E can correspond to operation 112 (FIG. 1). The side view 201E includes the first semiconductor layer 204 on the silicon substrate 202. The side view 201E includes the first portion of the second semiconductor layer 208A directly on the first semiconductor layer 204 in the first area 216. The side view 201E also includes a third semiconductor layer 214 formed directly on the first semiconductor layer 204 in the second area 218. In embodiments, the third semiconductor layer 214 can be formed adjacent to the insulating trench 210. The third semiconductor layer 214 can be formed using type III-V semiconductor material. In embodiments, the third semiconductor layer 214 can be formed on the first semiconductor layer 204 by epitaxial growth. The third semiconductor layer 214 can be the same or substantially similar as described herein. The insulating trench 210 can electrically insulate the first portion of the second semiconductor layer 208A from the third semiconductor layer 214.

Figure 2F:
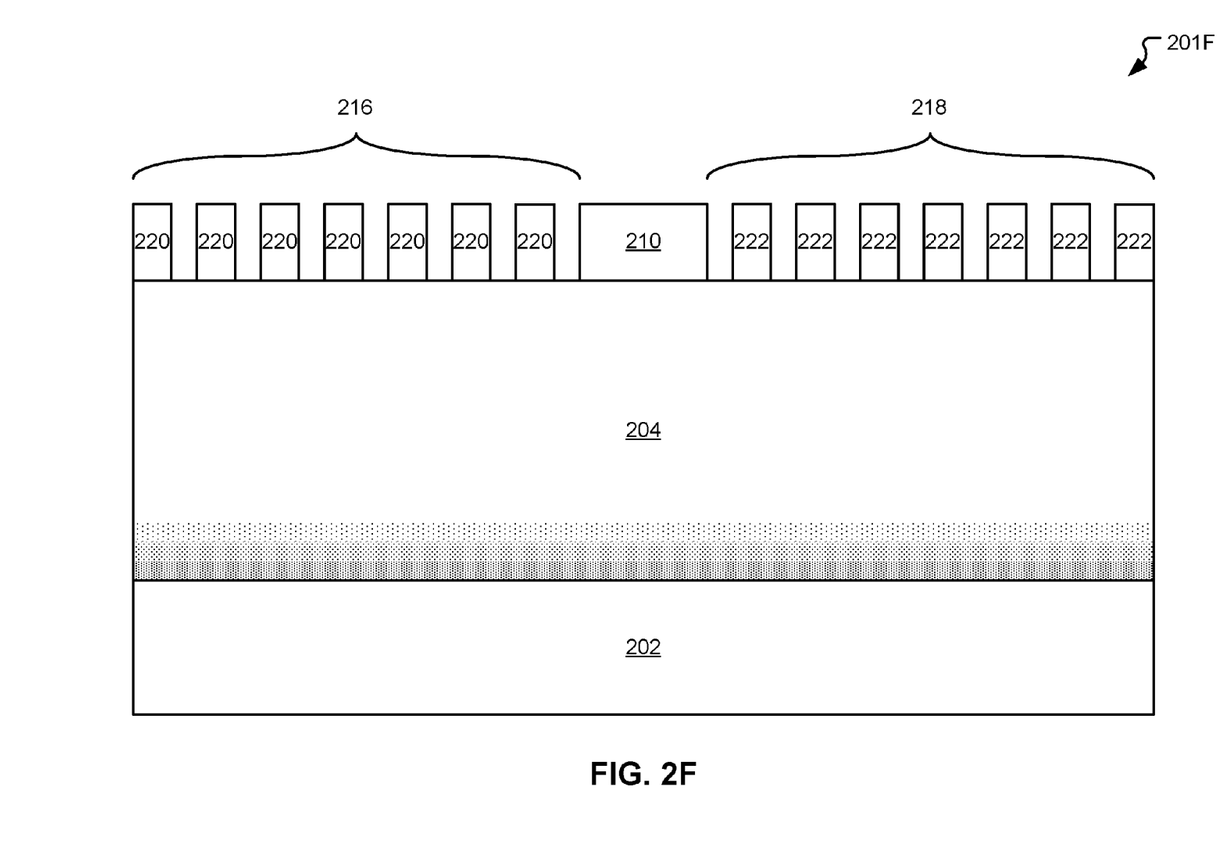

Referring now to FIG. 2F, a cross sectional side view 201F of a stage of forming a semiconductor device can be seen according to embodiments of the present disclosure. In embodiments, the side view 201F can correspond to operation 114 (FIG. 1). The side view 201F includes the first semiconductor layer 204 on the silicon substrate 202. The side view 201F includes a first set of semiconductor fins 220 and a second set of semiconductor fins 222 directly on the first semiconductor layer 204. In embodiments, the first set of semiconductor fins 220 can be defined by a first set of trenches etched into the first portion of the second semiconductor layer 208A (FIG. 2E) and a second set of trenches etched into the third semiconductor layer 214 (FIG. 2E).

Figure 3A:
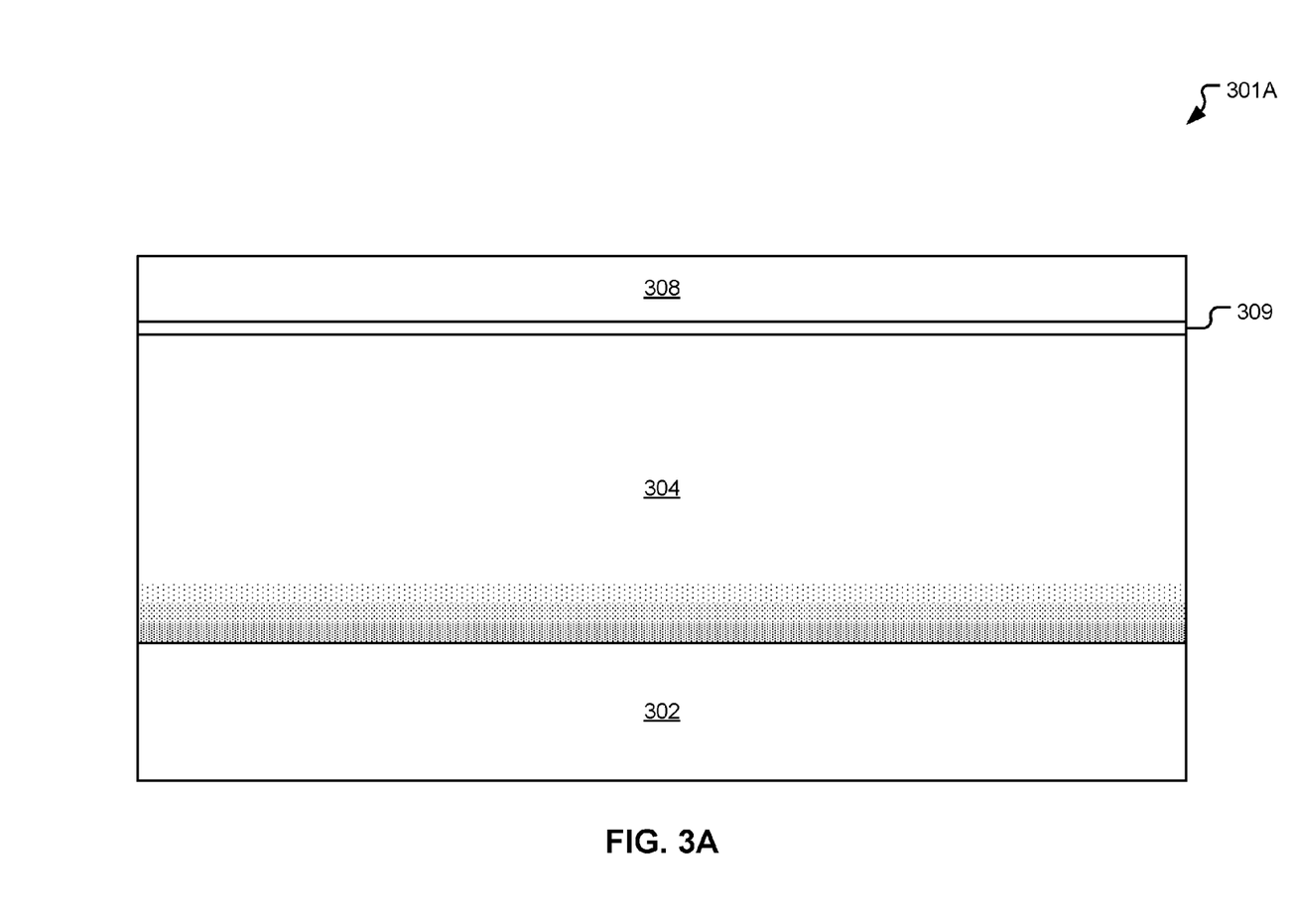
FIGS. 3A-3D depict cross section side views of stages of forming a semiconductor device including a first insulating layer, according to embodiments of the present disclosure.

Referring now to FIG. 3A, a cross sectional side view 301A of a stage of forming a semiconductor device can be seen according to embodiments of the present disclosure. In embodiments, the side view 301A can correspond to operations 104 and 106 (FIG. 1). The side view 301A includes a silicon substrate 302 and a first semiconductor layer 304 formed directly on the silicon substrate 302, as described herein. The silicon substrate 302 and the first semiconductor layer 304 can be the same or substantially similar as described herein.

The side view 301A includes a first insulating layer 309 formed directly on the first semiconductor layer. The first insulating layer 309 can be the same or substantially similar as described herein. In embodiments, the first insulating layer 309 can be formed by epitaxial growth of the layer on the first semiconductor layer 304. In some embodiments, the first insulating layer 309 can be formed using wafer bonding techniques. The second semiconductor layer 308 can be formed directly on the first insulating layer. In embodiments, the second semiconductor layer 308 can be formed on the first insulating layer using wafer bonding techniques. The second semiconductor layer 308 can be the same or substantially similar as described herein.

Figure 3B:
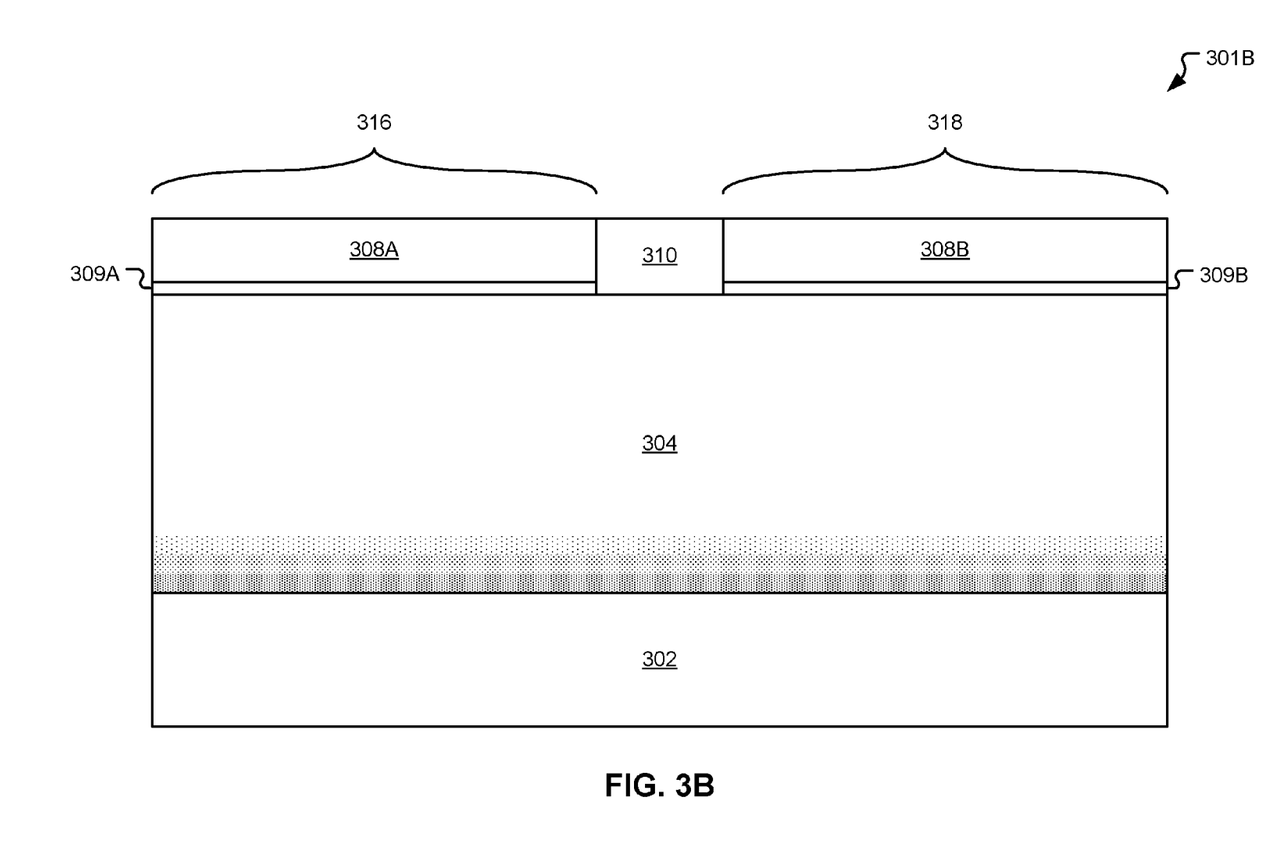

Referring now to FIG. 3B, a cross sectional side view 301B of a stage of forming a semiconductor device can be seen according to embodiments of the present disclosure. In embodiments, the side view 301B can correspond to operation 108 (FIG. 1). The side view 301B includes an insulating trench 310 defining a first area 316 separated from a second area 318. The first area 316 can include a first portion of the second semiconductor layer 308A and a first portion of the first insulating layer 309A. The second area 318 can include a second portion of the second semiconductor layer 308B and a second portion of the first insulating layer 309B. In embodiments, the insulating trench 310 can be formed using shallow trench isolation techniques, as described herein. The insulating trench 310 can be the same or substantially similar as described herein.

Figure 3C:
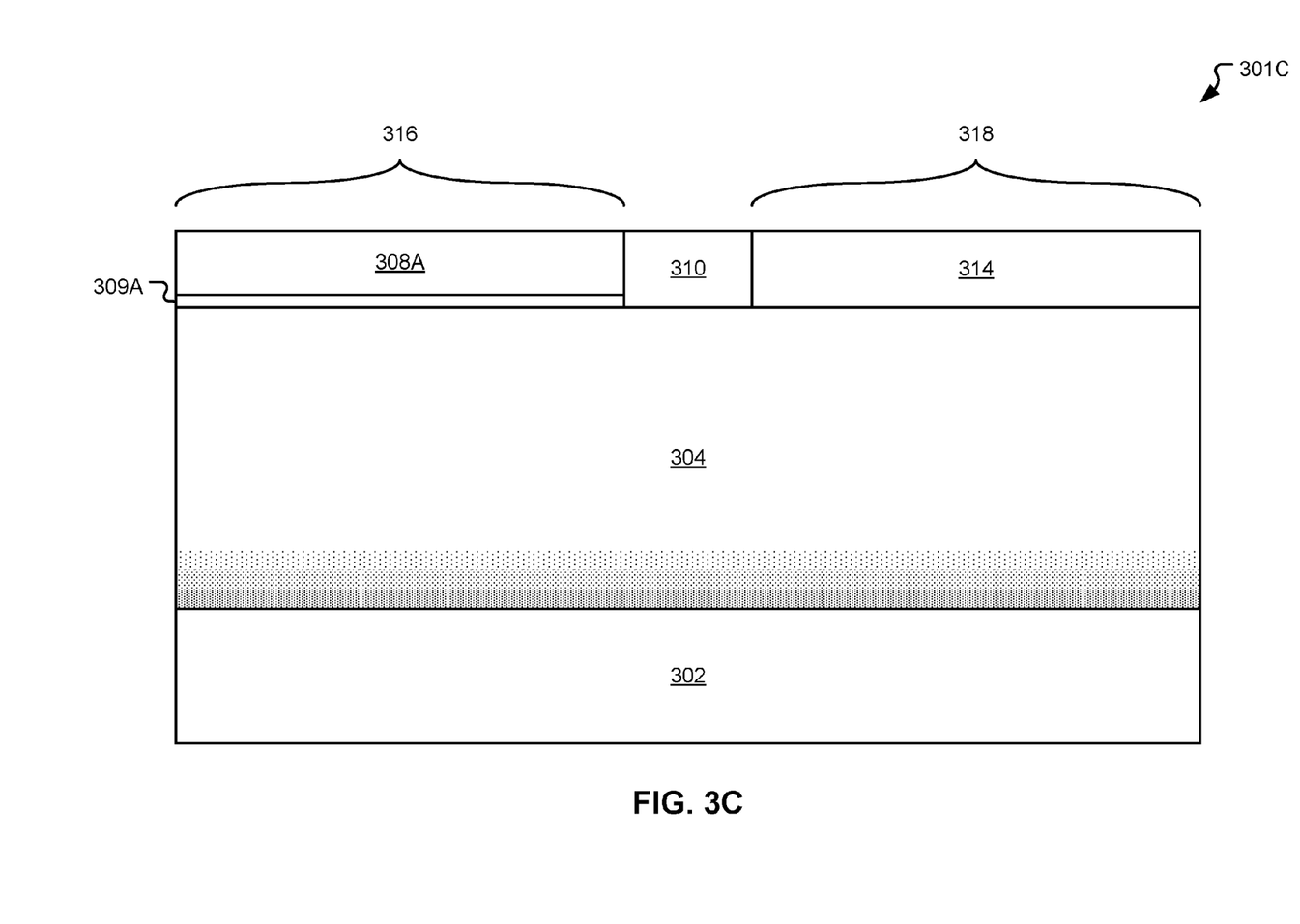

Referring now to FIG. 3C, a cross sectional side view 301C of a stage of forming a semiconductor device can be seen according to embodiments of the present disclosure. In embodiments, the side view 301C can correspond to operations 110 and 112 (FIG. 1). The side view 301C includes the first semiconductor layer 304 on the silicon substrate 302. The side view 301C includes the first portion of the second semiconductor layer 308A directly on the first portion of the first insulating layer 309A in the first area 316. The side view 301C also includes a third semiconductor layer 314 formed directly on the first semiconductor layer 304 in the second area 318. The third semiconductor layer 314 can be formed subsequent to removal of the second portion of the second semiconductor layer 308B (FIG. 3B) and the second portion of the first insulating layer 309B (FIG. 3B). The second portion of the second semiconductor layer 308B and the second portion of the first insulating layer 309B can be removed in the same or substantially similar manner as described with reference to FIG. 2D.

The third semiconductor layer 314 can be the same or substantially similar as described herein. The insulating trench 310 can electrically insulate the first portion of the second semiconductor layer 308A and the first portion of the first insulating layer 309A from the third semiconductor layer 314.

Figure 3D:
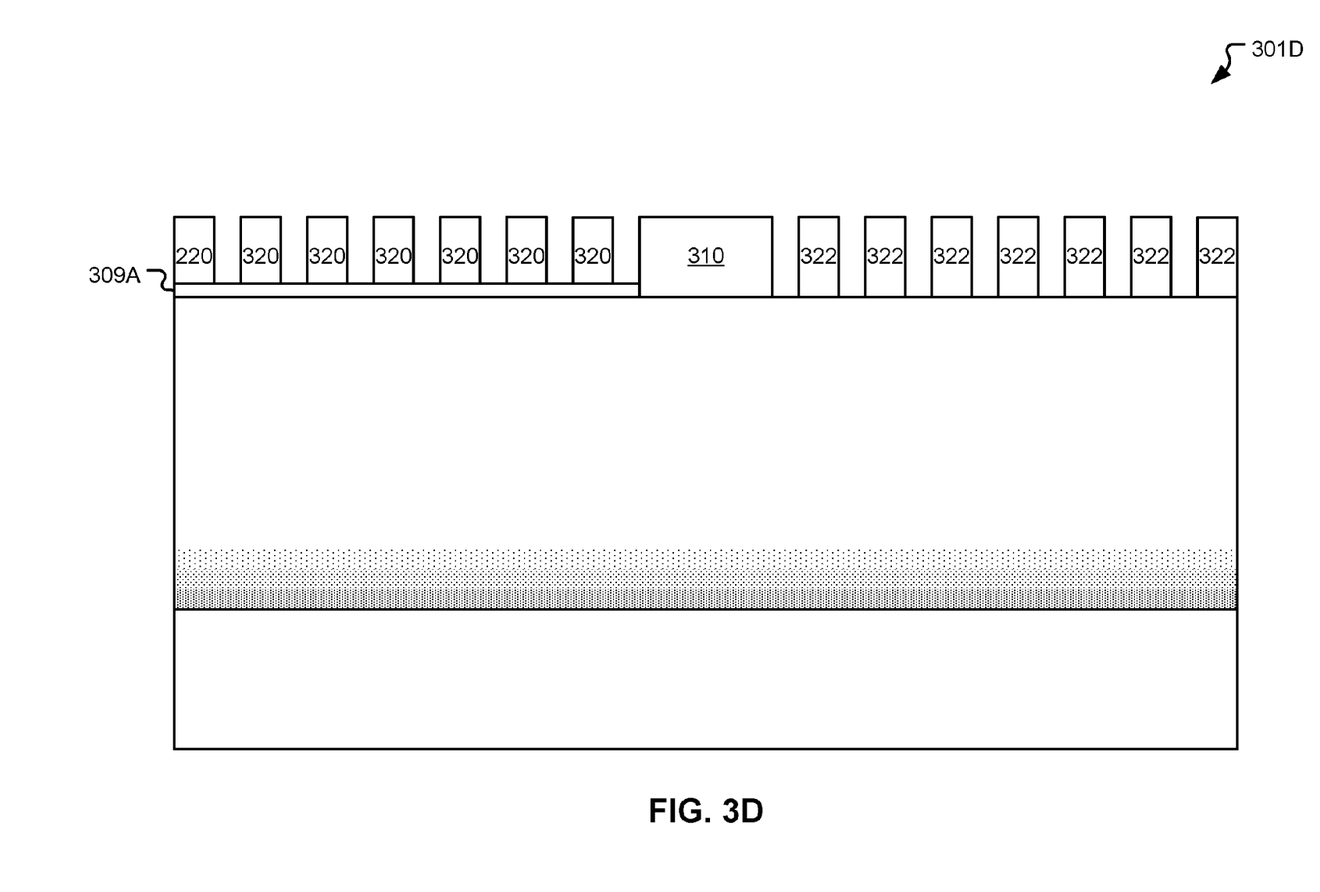

Referring now to FIG. 3D, a cross sectional side view 301D of a stage of forming a semiconductor device can be seen according to embodiments of the present disclosure. In operation 114 (FIG. 1). The side view 301D includes a first set of semiconductor fins 320 and a second set of semiconductor fins 322. The first set of semiconductor fins are directly on the first portion of the first insulating layer 309A. In embodiments, the first set of semiconductor fins 320 can be defined by a first set of trenches etched into the first portion of the second semiconductor layer 308A (FIG. 3C), as described herein. In embodiments, the second set of semiconductor fins 322 can be defined by a second set of trenches etched into the third semiconductor layer 314, as described herein.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of forming a semiconductor device comprising:
    forming a first semiconductor layer directly on a silicon substrate, the first semiconductor layer having a first region adjacent to an interface between the first semiconductor layer and the silicon substrate and a second region adjacent to the first region, the first region including a first concentration of defects and the second region including a second concentration of defects;
    forming a second semiconductor layer directly on the first semiconductor layer;
    forming an insulating trench in the second semiconductor layer defining a first portion of the second semiconductor layer electrically insulated from a second portion of the second semiconductor layer;
    removing the second portion of the second semiconductor layer; and
    forming a third semiconductor layer directly on the first semiconductor layer and adjacent to the insulating trench such that the first portion of second semiconductor layer is electrically insulated from the third semiconductor layer;
    wherein the first semiconductor layer and the third semiconductor layer are each a type III-V semiconductor and the second semiconductor layer is a type IV semiconductor, and wherein the second concentration of defects is less than the first concentration of defects.

2. The method according to claim 1, further comprising:
    etching a first set of trenches in the second semiconductor layer, the first set of trenches etched through the second semiconductor layer to define a first set of semiconductor fins from the second semiconductor layer; and
    etching a second set of trenches in the third semiconductor layer, the second set of trenches etched through the third semiconductor layer to define a second set of semiconductor fins from the third semiconductor layer.

3. The method according to claim 1, wherein:
    the second semiconductor layer is formed directly on the first semiconductor layer using a wafer bonding technique.

4. The method according to claim 1, wherein:
    removing the second portion of the second semiconductor layer includes:
        masking the first portion of the second semiconductor layer using an insulating material; and
        etching the second portion of the second semiconductor layer through to the first semiconductor layer.

5. The method according to claim 1, wherein:
    the first semiconductor layer is a semi-insulating type III-V semiconductor.

6. The method according to claim 1, wherein:
    the first semiconductor layer is a thickness approximately within a range of 500 nanometers to 5 microns.

7. A method of forming a semiconductor device comprising:
    forming a first semiconductor layer directly on a silicon substrate, the first semiconductor layer having a first region adjacent to an interface between the first semiconductor layer and the silicon substrate and a second region adjacent to the first region, the first region including a first concentration of defects and the second region including a second concentration of defects;
    forming a first insulating layer directly on the first semiconductor layer;
    forming a second semiconductor layer directly on the first insulating layer;
    forming an insulating trench in the second semiconductor layer and the first insulating layer defining a first portion of the second semiconductor layer and a first portion of the first insulating layer electrically insulated from a second portion of the second semiconductor layer and a second portion of the first insulating layer;
    removing the second portion of the second semiconductor layer and the second portion of the first insulating layer; and
    forming a third semiconductor layer directly on the first semiconductor layer adjacent to the insulating trench such that the third semiconductor layer is electrically insulated from the first portion of the second semiconductor layer and the first portion of the first insulating layer;
    wherein the first semiconductor layer and the third semiconductor layer are each a type III-V semiconductor and the second semiconductor layer is a type IV semiconductor, and wherein the second concentration of defects is less than the first concentration of defects.

8. The method according to claim 7, further comprising:
    etching a first set of trenches in the second semiconductor layer, the first set of trenches etched through the second semiconductor layer to define a first set of semiconductor fins from the second semiconductor layer; and
    etching a second set of trenches in the third semiconductor layer, the second set of trenches etched through the third semiconductor layer to define a second set of semiconductor fins from the third semiconductor layer.

9. The method according to claim 7, wherein:
    the second semiconductor layer is formed directly on the first semiconductor layer using a wafer bonding technique.

10. The method according to claim 7, wherein:
    removing the second portion second semiconductor layer includes:
        masking the first portion of the second semiconductor layer using an insulating material; and
        etching the second portion of the second semiconductor layer through to the first semiconductor layer.

11. The method according to claim 7, wherein:
    the first semiconductor layer is a semi-insulating type III-V semiconductor.

12. The method according to claim 7, wherein:
    the first semiconductor layer is a wide bandgap type III-V semiconductor.

13. The method according to claim 7, wherein:
the first semiconductor layer is a thickness approximately within a range of 500 nanometers to 10 microns.

* * * * *